United States Patent

Palara

[11] Patent Number: 5,939,768
[45] Date of Patent: Aug. 17, 1999

[54] VERTICAL BIPOLAR POWER TRANSISTOR WITH AN INTEGRATED SENSING CIRCUIT

[75] Inventor: Sergio Palara, Acitrezza, Italy

[73] Assignee: STMicroelectronics, S.r.l., Agrate Brianza, Italy

[21] Appl. No.: 08/866,904

[22] Filed: May 30, 1997

[30] Foreign Application Priority Data

May 31, 1996 [EP] European Pat. Off. ............ 96830310

[51] Int. Cl.⁶ .............. H01L 27/082; H01L 27/102; H01L 29/70; H01L 31/11
[52] U.S. Cl. .......... 257/577; 257/578; 257/579; 257/582; 257/591
[58] Field of Search .................. 257/577, 578, 257/579, 582, 591

[56] References Cited

U.S. PATENT DOCUMENTS

| | | | |
|---|---|---|---|
| 5,111,269 | 5/1992 | Tsugaru | 257/582 |
| 5,281,872 | 1/1994 | Mori | 307/491 |
| 5,408,124 | 4/1995 | Palara | 257/582 X |
| 5,557,139 | 9/1996 | Palara | 257/577 X |

FOREIGN PATENT DOCUMENTS

| | | | |
|---|---|---|---|
| 0544364 A3 | 6/1993 | European Pat. Off. | H01L 29/73 |
| 0625797 A1 | 11/1994 | European Pat. Off. | H01L 27/02 |
| 0632505 A1 | 1/1995 | European Pat. Off. | H01L 29/73 |

*Primary Examiner*—William Mintel
*Attorney, Agent, or Firm*—David V. Carlson; Kevin S. Ross; Seed and Berry LLP

[57] ABSTRACT

A vertical structure, integrated bipolar transistor incorporating a current sensing resistor, comprises a collector region, a base region overlying the collector region, and an emitter region over the base region. The emitter region comprises a buried region a surface region, and a first vertical diffusion region connecting the buried layer to the surface region. A second vertical diffusion region connects the buried emitter layer periphery to a first surface contact, while the surface emitter region is contacted, along three peripheral sides thereof, by a second surface contact. The transistor current flows from the substrate, through the base to the buried emitter region. It is then conveyed into the vertical region, which represents a resistive path, and on reaching the surface region splits between two resistive paths included between the vertical region and the surface contacts. These resistive paths form in combination the current sensing resistor incorporated to the transistor, whose terminals are led to the first and second surface contacts, respectively.

11 Claims, 3 Drawing Sheets

VERTICAL BIPOLAR POWER TRANSISTOR WITH AN INTEGRATED SENSING CIRCUIT

FIELD OF THE INVENTION

This invention relates to a vertical structure, bipolar power transistor integrated on a semiconductor material substrate and incorporating an emitter current sensing resistor.

BACKGROUND ART

A vertical structure, bipolar power transistor comprises a substrate of the N+ type overlaid by an N− epitaxial layer wherein an isolation well of the P type is formed whose ends are flush with the device surface.

The substrate provides the transistor collector, while the isolation well, contacted at the device surface, provides the transistor base.

The emitter region usually consists of one or more regions of the N+ type formed within the P-well and being contacted at the surface by conduction paths referred to as the metallizations, or briefly the "metals."

The current through a power transistor is sensed by measuring the voltage drop across a resistor, generally provided in series with the terminal, the voltage drop being due to the current flowing through the transistor. This resistor, known as the "sensing" resistor, is usually integrated to the device in an area close to that of the power transistor, or alternatively, formed by modifying somewhat the transistor structure, as shown in FIGS. 1, 2 and 3.

FIG. 1 is a plan view of a prior power transistor incorporating a sensing resistor. Also shown in the figure are the base and emitter metallizations 40 and 41, respectively, in contact with corresponding buried regions, not illustrated in the figure.

A sensing resistor 42 is formed from a metallization section placed in series with the emitter contact 43. A current is caused to flow through the sensing resistor 42 in the metallization section which is proportional to the total emitter current and produces a voltage drop that can be easily sensed, e.g., by means of two contacts 44 and 45 as shown in the Figure.

FIG. 2 is a plan view of another prior power transistor, also incorporating a sensing resistor. A base metallization 20 and emitter metallization 21 contact corresponding buried base and emitter regions, not illustrated in the Figure.

The emitter region is split into plural zones, referred to as the emitter "fingers" on account of their peculiar shape and which are connected together by the emitter metal 21. The emitter current is measured here by measuring, through contacts 24 and 25, the difference of potential across the metallization of an emitter finger 22.

FIG. 3 is a plan view of a further prior power transistor to which a surface diffused sensing resistor RS has been incorporated. In particular, in order to take a measurement of emitter current, the difference of potential across a diffused resistor RS, being placed in series with an emitter portion and similarly doped, is measured. Two base metallizations 30 and an emitter metallization 31 contact respective base and emitter regions.

The active region 32 of the emitter is contacted by means of a first emitter contact C1 and a metallization 34, while the resistor RS is contacted by means of a second emitter contact C2 and a metallization 35. The difference of potential across the resistor RS, as due to the current flowing from the emitter active region to the second emitter contact C2, is measured between the ends of said metallizations 34 and 35.

Thus, in prior integrated structures, the sensing resistor has been formed at the surface by having metallization or diffusion areas modified in or added to the structure of the power transistor. These techniques invariably result in an increase of the area occupied by the power transistor.

SUMMARY OF THE INVENTION

The underlying solution provided by this invention is to provide a vertical structure, integrated bipolar transistor incorporating a current sensing resistor which involves no increase of the total area occupied by the transistor, or at least for an increase of trivial significance in occupied area.

According to principles of the present invention, a vertical structure, integrated bipolar transistor incorporating a current-sensing resistor, is provided as indicated above.

On an N-type substrate an N-type epitaxial or epi layer is grown. The epi layer will form the collector of the transistor. Within the epi layer, a P-well is made with vertical areas reaching to the surface. A portion of this P-well makes up the base region.

Within the base region, an N+ region forming the buried emitter is deposited. This layer, too, has vertical areas for reaching the surface.

Another N+ type diffusion is formed reaching from one of the vertical areas of the buried emitter region horizontally across the top surface of the substrate where it contacts a metal layer. This horizontal diffusion region, being of a different doping level than the first vertical diffusion region, has a greater resistance to current flow. Since this resistance is proportional to the amount of current flowing through the buried emitter, measuring the resistance allows the current flowing through the transistor to be calculated.

The features of this invention can be better appreciated by having reference to the following detailed description of some embodiments thereof illustrated, by way of example and not of limitation, in the accompanying drawings.

DETAILED DESCRIPTION

Figure 4:
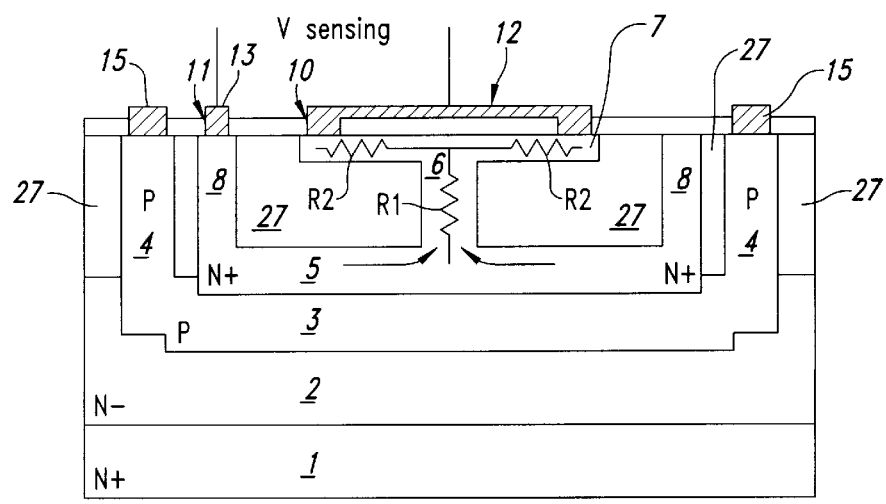
FIG. 4 is a sectional view taken along the Section line A–A' of FIG. 5 through the structure of a bipolar power transistor incorporating a sensing resistor, according to this invention.
Figure 5:
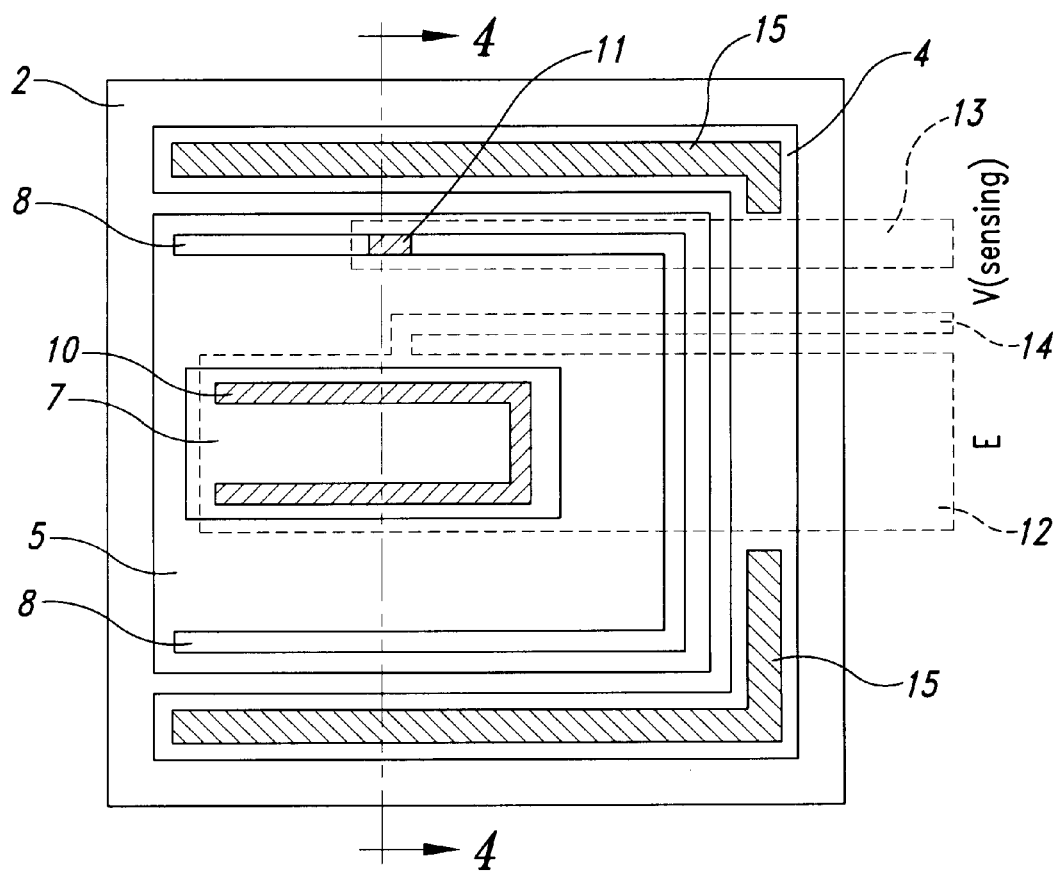
FIG. 5 is a plan view of the power transistor shown in FIG. 4 and embodying this invention.

FIGS. 4 and 5 show a vertical structure, bipolar power transistor of the NPN type, FIG. 4 being a sectional view and FIG. 5 a plan view of the transistor structure.

The structure shown in FIG. 4 includes, from bottom to top, a substrate 1 of an N+ doped semiconductor material having a dopant concentration of between 5E19 and 1E20 $cm^3$. The substrate 1 is overlaid by an N− doped epitaxial layer 2, grown with epitaxial techniques known per se. The resistivity of the epitaxial layer 2 is between 50 and 60 ohm*cm. The substrate 1 forms, jointly with the epitaxial layer 2, the collector of the transistor.

A region, with P conductivity, comprises a buried base region 3 in the epitaxial layer 2 and is connected to surface base contacts 15 by vertical diffusion regions 4 having the same type of conductivity, with dopant concentrations of 5E13 to 1E14 cm$^3$.

Formed over the base region is a buried emitter region 5 with N+ conductivity, also formed within the epitaxial layer 2. The buried emitter region 5 has a dopant concentration of 3E15 to 5E15 cm$^3$.

A second epitaxial layer 27 is grown after buried emitter region 5 is formed. The second epitaxial layer 27 has a resistivity of 5 ohm*cm.

A vertical diffusion region 6, of the N+ type, and having a concentration in a range of 5E19 cm$^3$ is then formed in the second epi layer 27 to contact the buried emitter 5. A further surface region 7 having the same type of conductivity, but having a dopant concentration level of 1E19 cm$^3$ is then formed.

An emitter contact 10, from which an emitter current is taken via a metallization line 12, is formed at the edge of the surface region 7.

A vertical region 8 of the N+ type having the same concentration as diffusion region 6 brings to the surface the edge of the buried emitter region 5 and is then contacted by a contact 11 and a metallization line 13.

The transistor current will flow from the substrate 1, through the base 3, to the emitter 5. It is then forced to go through the region 6, representing a resistive path designated R1 in the figure, and on reaching the surface region 7 splits between two resistive paths R2 included between the region 6 and the emitter contacts 10.

Thus, the resistance met by the emitter current will be the combined resistance of the resistor R1 and the two resistors R2 in parallel, i.e.:

$$RS=R1+R2/2.$$

This resistance is put to use as a sense resistor for sensing the emitter current, by contacting it, at one end, through the contact 11 and vertical region 8, and at the other end, through the emitter contact 10 located at the edge of the surface region 7.

The current flowing through the transistor will, in fact, be proportional to the voltage drop across the sensing resistor RS, and this difference of potential can be easily sensed on the metallization lines 12 and 13. The current can then be calculated using any standard known technique.

In an alternative embodiment the device can be implemented with only a single epitaxial layer used in the structure. Thus, the invention can be utilized in a process which uses one epi layer or two epi layers, or more as desired.

FIG. 5 is a plan view of the bipolar power transistor shown, in section, in FIG. 4, which highlights the epitaxial layer 2 overlying the substrate 1 (not shown in FIG. 5), part of the buried regions, and some of the metalization lines.

In particular, the buried emitter region 5 is noticeable, overlaid by the surface region 7. The vertical region 8 connects, along three sides, the buried emitter region 5 to the device surface. Vertical region 8 is connected to the metallization line 13 by the contact 11.

The emitter contact 10 can be seen at the edge of the surface region 7 from which the emitter current is taken through the metallization line 12; another metallization line 14 used for sensing the drop of potential across the sensing resistor extends from line 12.

Thus, the sensing resistor RS=R1+R2/2 is contacted by the two metallization lines 13 and 14. Line 14 in this figure branches off the emitter metal 12 and is expediently utilized for sensing the voltage on the resistor RS.

As can be appreciated from FIG. 4, as well as from FIG. 5, this invention provides for the formation of a sensing resistor which can be integrated to the structure of a bipolar power transistor without involving increased area occupation.

Figure 1:
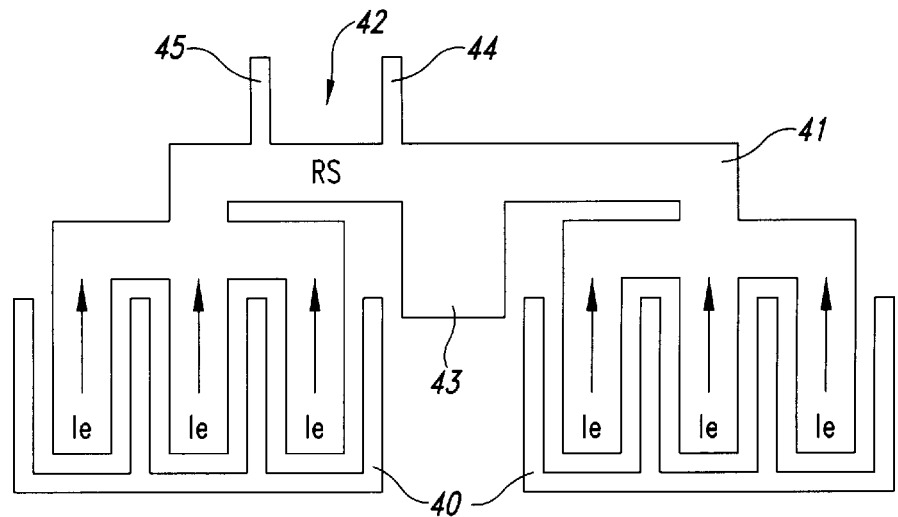
FIG. 1 is a plan view of a first power transistor incorporating a sensing resistor, according to the prior art.
Figure 2:
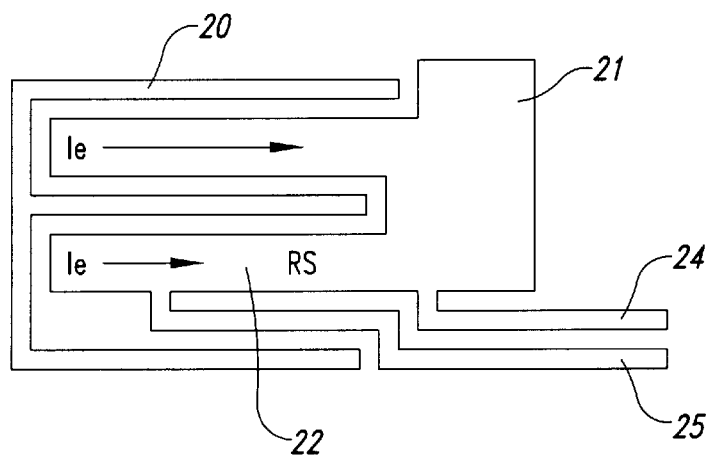
FIG. 2 is a plan view of a second power transistor, also incorporating a sensing resistor and according to the prior art.
Figure 3:
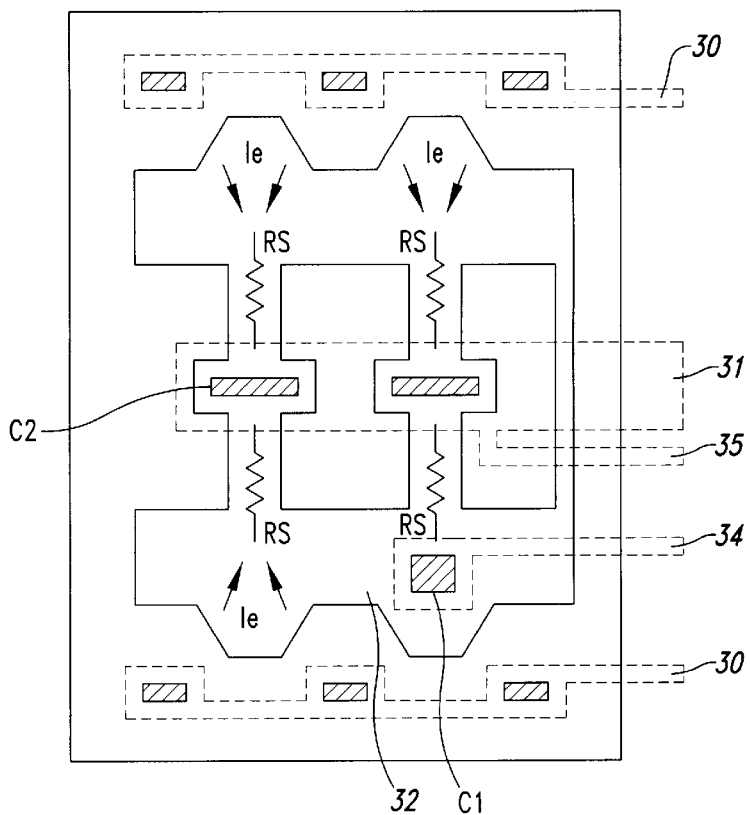
FIG. 3 is a plan view of a third power transistor incorporating a sensing resistor, according to the prior art.

In fact, whereas in prior devices, as shown in FIGS. 1, 2 and 3, the sensing resistor is formed at the surface, thus using up a significant area, in this invention it is formed part vertically (R1) and part horizontally (R2) over the buried emitter region 5.

What is claimed is:

1. A vertical structure, integrated bipolar transistor incorporating a current sensing resistor integrated on a substrate with conductivity of a first type on which an epitaxial layer with the same type of conductivity has been grown, comprising:

a collector region provided by the substrate;

a base region with conductivity of a second type, being buried in the epitaxial layer and connected to a surface base contact through at least a first vertical diffusion region; and an emitter region with conductivity of only the first type, comprising a buried layer in a second epitaxial layer formed over the base region, a surface region, and at least a second vertical diffusion region connecting the buried layer to the surface region wherein at least a third vertical diffusion region is provided to connect the buried emitter layer to a first surface emitter contact, and that the surface emitter region is contacted, along at least two peripheral sides thereof, by second surface emitter contacts.

2. The transistor according to claim 1 wherein the surface emitter region is contacted by the second surface emitter contact along three peripheral sides thereof.

3. The transistor according to claim 1 wherein the regions contacted by said first and second surface contacts form said sensing resistor.

4. The transistor according to claim 3 wherein an emitter current is taken through a metallization in electric contact with the second surface emitter contact.

5. The transistor according to claim 4 wherein a voltage drop proportional to the emitter current is sensed by means of said first and second surface contacts.

6. The transistor according to claim 5 wherein the third vertical diffusion region extends along at least two sides of the buried emitter layer.

7. A bipolar transistor including an integrated sensing resistor by which emitter current can be measured, comprising:

a collector region formed of a first epitaxial layer grown on a semiconductor substrate having a first conductivity type;

a base region formed of a second conductivity type, and adjacent to the collector region, the base region including vertical diffusions extending to a first surface of the substrate;

an emitter region solely of the first conductivity type formed in a second epitaxial layer of the first conductivity type grown adjacent to the base region, the emitter region including vertical diffusions extending to the first surface of the substrate; and a resistive vertical diffusion, formed of the first conductivity type between the emitter region and the first surface of the substrate.

8. The bipolar transistor of claim 7, further including:

a resistive surface emitter region having the same conductivity type as the resistive vertical diffusion, the surface emitter region formed along the first surface of the substrate and coupled to the resistive vertical diffusion.

9. The bipolar transistor of claim 8 wherein:

the resistive vertical diffusion is coupled to the resistive surface emitter region along at least two peripheral sides.

10. The bipolar transistor of claim 7, further including:

one or more base contacts located at the first surface of the substrate coupled to the vertical diffusions of the base region;

one or more emitter contacts located at the first surface of the substrate coupled to the vertical diffusions of the emitter region; and one or more emitter resistor contacts at the first surface of the substrate coupled to the resistive vertical diffusion.

11. The bipolar transistor of claim 10, further including:

means for measuring an emitter voltage level at one of the emitter contacts;

means for measuring a second emitter voltage level at the resistor emitter contact; and means for calculating an emitter current based on the two measured voltage levels.

\* \* \* \* \*